(12) United States Patent
Yu et al.

(10) Patent No.: US 6,263,303 B1
(45) Date of Patent: Jul. 17, 2001

(54) SIMULATOR ARCHITECTURE

(75) Inventors: Gong-san Yu, Milpitas; Tilman H.S.T.M. Kolks, Palo Alto, both of CA (US)

(73) Assignees: Sony Corporation, Tokyo (JP); Sony Electromocs Inc., Park Ridge, NJ (US)

(*) Notice: Subject to any disclaimer, the term of this patent is extended or adjusted under 35 U.S.C. 154(b) by 0 days.

(21) Appl. No.: 09/178,676

(22) Filed: Oct. 26, 1998

(51) Int. Cl.[7] .................................................. G06F 9/455
(52) U.S. Cl. .............................. 703/19; 703/16; 703/20; 703/22; 714/738
(58) Field of Search ............................... 703/16, 20, 19, 703/22; 713/502; 714/738

(56) References Cited

U.S. PATENT DOCUMENTS

| | | | |
|---|---|---|---|
| 4,493,045 | * | 1/1985 | Hughes, Jr. .......................... 364/580 |
| 5,111,413 | * | 5/1992 | Lazansky et al. .................... 364/578 |
| 5,247,651 | * | 9/1993 | Clarisse ................................ 395/500 |
| 5,388,060 | * | 2/1995 | Adam, Jr. et al. ................... 364/578 |
| 5,499,373 | | 3/1996 | Richards et al. ..................... 395/154 |
| 5,608,893 | | 5/1997 | Slingwine et al. ................... 395/468 |
| 5,625,580 | * | 4/1997 | Read et al. ........................... 364/578 |
| 5,650,946 | | 7/1997 | Trimberger ........................... 364/578 |
| 5,726,918 | | 3/1998 | Giramma et al. .................... 364/575 |
| 5,748,875 | * | 5/1998 | Tzori .................................. 395/183.05 |
| 5,790,836 | * | 8/1998 | Mizuno ................................ 395/500 |
| 5,794,005 | | 8/1998 | Steinman ............................. 395/500 |

* cited by examiner

Primary Examiner—Kevin J. Teska
Assistant Examiner—Thai Phan
(74) Attorney, Agent, or Firm—Wood, Herron & Evans, L.L.P.

(57) ABSTRACT

An simulator particularly suited for simulating the hardware/software behavior of embedded systems. The architecture of the simulator permits the hardware and software systems to be modeled as modules with well characterized behaviors. A concise module definition syntax is used to describe module behaviors, and a translator operates upon the module to abstract operations of module behaviors at a level which does not require cycle-based, direct interaction of each module with the underlying simulation engine.

46 Claims, 7 Drawing Sheets

```
classVld : public Module Base {
public:
 InPort<W16> addr, dataIn;
 OutPort<W32> dataOut;                  ~172
 OutPort<W16> interrupt;
 OutPort<w12> bitstreamOut;
 ...
private:
 EventFunction DecAddress (InPort<W16> addr, dataIn);  ~174
 ...
}
EventFunction Vld::DecAddress (InPort<W16> addr, dataIn) {
 if (addr. value == VLD_ADDR)
  interrupt =0;
 else
  dataOut.send (dataIn.value *2, delay =5);  ~176
}
```

FIG. 7C

```
# Module declaration:
declare {
 module Vld : vld.h;
 module It  : it.h;
 module Mc  : mc.h;            ~178
 module Risc: risc.h; }
# Module instantiations:
define {
 module vld : Vld;
 module it  : It;
 module mc  : Mc;              ~180
 module risc: Risc;
 module mem : Memory (2048, 32, latency = 4); }
# Actual connections:
connect {
 Addr : risc.addr => vld.addr, me.addr;
 Data : risc.dataOut, mc.dataOut    ~182
     => vld.dataIn, risc.dataIn, mc.dataIn;
 Int  : vld.int, mc.int => risc.int;
 ...}
```

FIG. 7D

SIMULATOR ARCHITECTURE

FIELD OF THE INVENTION

The present invention relates to simulation of embedded digital hardware systems and software running on such systems.

BACKGROUND OF THE INVENTION

Simulation is the primary technique used to verify electronic system designs before substantial manufacturing expense is undertaken to produce prototypes. Simulation is a particularly important phase in the design of complex integrated circuitry such as central processing units or digital audio/video processors, because the manufacturing expense and delay in producing a prototype of an integrated circuit is substantial. Furthermore, even after a prototype has been produced, simulation is often useful to identify and debug problems encountered during testing of the prototype to determine whether there are design flaws.

While there are numerous commercially available simulation systems, all can be generally categorized into two groups: cycle-based simulators and event-driven simulators. Both are successful in modeling hardware at low levels, i.e., at a switch, gate or register level. In high level modeling, i.e. at or above the behavior level, module level or architecture level, current simulation techniques as used in industry are of limited use. Generally speaking, the description language used by simulators is normally not as flexible as general programming languages such as C/C++. As In the context of digital video decoding in particular, it will be noted that there are many C/C++ reference models, e.g. for MPEG/MEPG2 decoding, available in the public domain. Unfortunately, these reference models cannot be used in conventional simulators due to the limited description language provided by the simulator. A consequence, it is difficult to model a complete complex system at a high level, for example to perform embedded software verification.

The functional structure of a cycle-based simulator is illustrated in FIG. 1. Cycle-based simulators are typically used for relatively high-level simulation of the underlying hardware system. Typically, in a cycle-based simulator, a software module 10 is generated for each hardware component of the system, the module modeling the high-level behavior of the corresponding hardware component. Global variables 12 stored and managed by the underlying operating system, are used to represent the transfer of information between each hardware component. Each module is responsive to a triggering signal simulating the passage of time. A processing core 14 generates these trigger signals and delivers the trigger signals sequentially to each module 10.

When triggered, a module 10 responds by performing processing tasks, based upon the current values of global variables 12 or a current internal state. As part of this processing, a module may modify a global variable 12, simulating an output of the corresponding hardware stricture.

When modeling a complex system, cycle-based simulation has the drawback that, by its nature, a cycle-based simulator prevents the simulation of a module or function that operates over multiple cycles. Consequently, computation delays and pipelined structures are difficult to model at a high level of abstraction. Furthermore, cycle-based simulation requires that the simulation core trigger each module 10 during each simulated time period. In a complex simulated system, there may be many modules that will take action or produce a changed output only every, e.g., 100 clock cycles. As a consequence, 99% of the time a call to such a module will not produce any meaningful activity, but rather will, at most, simply increment a counter internal to the module. Thus, there is inefficiency in a cycle-based simulation, particularly in a complex system in which may components are idle for large periods of time. Simulation of digital audio/video processors often suffer from both of these drawbacks.

The typical functional structure of an event-driven simulator is shown in FIG. 2. Event-driven simulators are typically used in simulation of low-level behaviors of the simulated system. Typically, in an event-driven simulator, the behaviors of low level components of a system, which may be individual logic gates captured from a hardware definition language (HDL), or abstractions of logic gates such as used in a register-transfer model, are defined in software modules 16. These software modules are responsive to "events" received by the module from the simulator core 18, and in response generate "events" which are delivered to the simulator core 18 for transfer to other software modules 16. The core 18 references an event-response table 20 to determine where events from a given module are to be transferred, and then transfers the events appropriately. As seen in FIG. 2, a first event(1), causes a module to generate a second event(2), which is transferred to two additional modules.

When an event is delivered to a component modeled by an module 16, a child process 22 is formed to execute code in the module. A current state 23 for the child process 22 is also formed, representing the event(s) triggering the child process and the current state of any global variables used as inputs to the module. This child process then executes under control of the operating system based on the code in the module, until its execution is completed. Typically, an event-driven simulator operates on a multi-threading operating system, with each child process represented by a separate thread.

While an event-based simulator provides highly accurate modeling of detailed behaviors not typically captured by cycle-based simulators, it is relatively difficult to define simulation of complex circuit structures, since the nature of the simulation language does not readily permit definition of such structures. Often the task of preparing an event-driven simulation model is left to an automated simulation compiler operating directly on HDL, which produces an extremely detailed low-level model of behaviors. Furthermore, if event-based simulation is used to model a complex circuit structure in which the actions performed in response to an event are relatively lengthy, a large number chains of child processes may be produced, substantially greater in number than the original number of modules. For example, if an event(0) is followed quickly by an event(1), a child process or several such processes may be generated from the receipt of event(0) at a module 22, and while this child process is continuing to execute in response to its stored state, a second child process may be generated from the receipt of event(1) at the module. If each child process takes a duration of time to complete, still further child processes may be triggered from the same module, resulting in a substantial multiplication of child processes corresponding to a single module. In a complex system with multiple state machines, pipelined sections with delays, the resulting "blooming" of child processes, and the overhead involved in process swapping between each child process in a multithreading operating system, can overwhelm the system and substantially slow processing.

In simulation of a digital audio/video processor for simultaneously decoding audio and video digital television signals, it has been found that an event-based simulator was faster than a cycle-based simulator. However, due to the complexity of the underlying system, process swapping in the event-based simulator consumed more processor time than any other operation. Partly as a consequence of this inefficiency, simulation of a decoding of a single video frame consumed approximately one day of simulation by a workstation. This is far too slow to appropriately simulate all of the functions that must be simulated to verify a design. In particular, to verify that audio/video synchronization is properly operating, decoding of one hundred or more frames of video must be simulated to determine whether synchronization is being performed properly.

SUMMARY OF THE INVENTION

Accordingly, there is a need for a simulator that is appropriate for high complexity systems such as embedded processing systems, such as a digital audio/video decoder. This need is met in accordance with principles of the present invention.

The present invention provides a simulator which is neither event-driven nor cycle-based. Specifically, simulation modules may generate and respond to events in an unscheduled manner as is the case in an event-driven simulator, but simulation modules may also schedule activities in accordance with predefined cycles, as is the case in a cycle-based simulator.

The author of a simulation program is free to choose the appropriate behavior to make an accurate simulation.

The basic design rules of a simulator in accordance with the present invention, are that components of the simulated system are simulated by independent and isolated modules that interact only using well-controlled input and output ports. Furthermore, all actions of each executable object used by the simulator, must be completed without delays. If a delayed stimulus is to be simulated, it is simulated by utilizing a special delay construct within the module definition, which produces a return to the simulator core, so that the core itself will generate the desired delayed stimulus at the appropriate time.

These design rules have two benefits. First, the independence and isolation of the modules, and the controlled input and output ports, permits the system to operate similarly to an event-driven simulator, in which modules will execute in a volatile manner, based on stimuli received from other modules, and typically only a subset of all executable objects used by the simulator will be executed at any one time, saving time and overhead as compared to a cycle-based simulation. However, at the same time, the use of special delay constructs limits the generation of multiple simultaneous instances of execution of the same module, and the resulting task-switching overhead that has been experienced with pure event-driven simulation; since individual modules must terminate without any delays, with any delayed stimuli returned to the simulator core, all executions in a chain reaction of executions will under normal conditions reach a terminal state where execution ceases, until restarted in a subsequent cycle by the simulator core generating the previously-stored delayed stimuli. Thus, there is a control on the "blooming" of excessive simultaneous instances of each module.

In accordance with the foregoing design rules, the simulation modules can be encoded directly in C/C++, permitting the direct use of existing public domain C/C++ simulation modules. Furthermore, this permits complex data structures to be passed between simulation modules, not limited to integers or other simple structures as is the case in currently popular simulation programs.

Specifically, in one aspect, the invention features a simulator in which a number of executable objects are defined, each simulating an operation performed by a component of a computing system in response to a stimulus. At least one of the objects, and typically many, generate a stimulus to be applied later in time in order to accurately represent a time delay of the processing functions performed by the simulated component. During operation of this simulator, stimuli are applied to cause execution of some, but not all, of the executable objects. Specifically, only those executable objects that receive a stimulus are executed. When an executable object produces an indication of a delayed stimulus to be applied later in time, an indication of the delayed stimulus is stored. Then, after completion of execution of all executable objects, the stored delayed stimulus is retrieved and applied to an executable object.

In specific embodiments of this aspect, executable objects also generate immediate stimuli to be immediately applied to other executable objects, which are applied to the other executable object without delay.

The executable objects include channel objects simulating a connection in said computing system, and transition objects and event function objects simulating a computational structure of said computing system. The event function objects, during execution, produce one or more immediate stimuli to be immediately applied to channel objects, and one or more delayed stimuli to be applied later in time to channel objects, and one or more delayed stimuli to be applied later in time to other event function objects. The channel objects, during execution, produce one or more immediate stimuli to be immediately applied to transition objects. The transition objects, during execution, apply conditions to stimuli applied thereto, and conditionally produce stimuli to be applied to event function objects.

In another aspect, the invention features a method of translating module definitions defining operations of a computational structure of said computing system, to produce executable objects to be used in simulating the computing system consistently with the above-defined design rules. This translation is of particular importance when a given segment of a given module definition requests delayed activity at a later time. In translating the given module definition into an executable object, executable code is generated from the given segment and stored in the executable object, including executable code that, during execution, will store a description of the delayed activity for later retrieval and execution.

In specific embodiments of this aspect, a module definition may specifically include a request for delayed execution of a given segment thereof. In this case, during translation of the module definition, first and second executable objects are formed for the module definition. The first executable object includes executable code that, during execution, will store a delayed stimulus to the second executable object. The second executable object includes executable code that, during execution, will execute the given segment of the module definition.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 7C is a more specific illustration of a module definition;

FIG. 7D is a more specific illustration of module declarations, instantiations, and a connection list delivered to the translation process.

DETAILED DESCRIPTION OF SPECIFIC EMBODIMENTS

With the foregoing background and summary, a simulator architecture in accordance with principles of the present invention can be explained. This simulator architecture provides a high degree of modularity and abstraction. Modularity is achieved through the an automated translation step that ties a module definition to the simulation engine, without user intervention.

Figure 3:
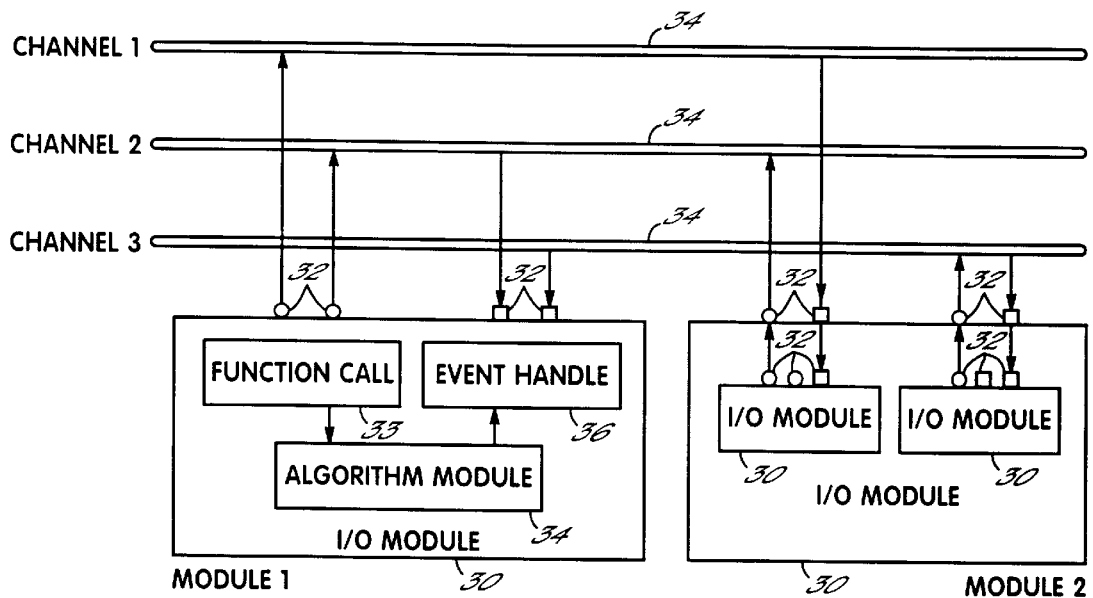
FIG. 3 is a functional diagram of the use of module, function, event and channel abstractions in a simulator in accordance with principles of the present invention.

In the module architecture, as seen in FIG. 3, modules operate independently and communicate only through a well-defined protocol. In this way the system can be composed of modules at varying levels of abstraction and can be easily reconfigured. In the translation step, as described in FIGS. 7A–8, behavioral definitions of the modules and a specification of their interconnection are translated automatically into an event-simulation model that correctly deals with simulation events. This allows for the modules to be specified without any detailed knowledge of the underlying simulation engine.

In FIG. 3, a pictoral overview is provided of the module architecture. The fundamental objects of the simulation are modules 30, their ports 32 and channels 34 between modules. In the following discussion each of these objects is described, as is their use in the definition of a module and in translation of a module definition into executable objects for incorporation into a cycle-accurate, event-driven simulator.

The basic representation of a hardware unit in the system is an I/O module 30. An I/O module 30 is a C++ class with two additional properties: port 32 declarations and functions.

Ports define the interface of a module to other modules, while the functions define the module's behavior. The input and output ports 32 of an I/O module are its connection with the external world and other modules. The ports, their direction and data type are specified in the class header of the C++ definition of the module. An I/O module exchanges data with its external world by reading and writing data from or to its ports.

Channels are many-to-many connections between ports of modules allowing data transmission between modules. They basically represent the connection among hardware blocks. When a data value is written to a module's output port in a module definition, the simulator will transfer the value from one port to other connects ports over the channel.

Module functions 33 define the behavior of a module. A function has a non-empty input port list as its arguments and is executed based on user-defined conditions on data arriving at the ports of the module. For example, a function 33 may execute only when data has arrived at all ports of the module. Or, the function 33 may execute when data has arrived at any of the ports of the module. Also, other more complex boolean conditions may be applied to data arriving at ports to determine when a function 33 is to execute. Inside a function, calculations can be performed, and in addition, data can be read from the input ports and written to the output ports. Data may be written to ports immediately, or after a specified delay, to model the cycle delay of the hardware unit that is simulated by the module. In addition, inside a function 33, a time delay may be specified, so that some of the calculations can be performed after the time delay, potentially based on different data values available at a later time as appropriate to model the cycle delay of the hardware unit that is simulated by the module.

The simulator further allows the use of algorithm modules 34. These are normal C++ classes without ports or functions. Algorithm modules 34 typically implement data processes, without considering the modeled hardware structure. This type of object is highly re-usable because there is no concept of hardware input/output ports, detailed hardware implementation, or process delay. Typical examples of uses of algorithm modules 34 are filter banks, variable-length encoders/decoders, and CPU instruction set execution. Algorithm modules do not require any special translation phase or simulation engine support. The use of I/O modules in conjunction with algorithm modules allows for rapid definition of a complete system at various levels of abstraction and cycle accuracy. An algorithm module 34 used by a function 33 in an I/O module 30 is shown in FIG. 3. The function 33 calls the algorithm module 34 to perform an underlying calculation, and receives in response an event handle 36 for the results of the underlying calculation.

Figure 4:
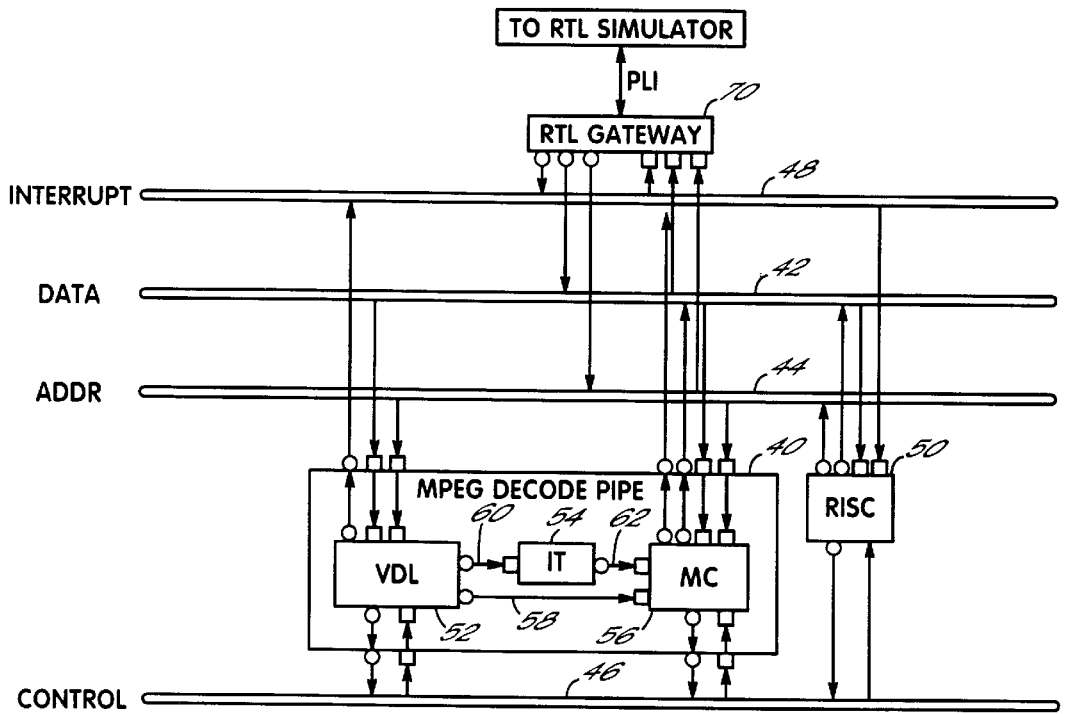
FIG. 4 is a functional diagram of a high-level simulation of a digital audio/video decoder in accordance with principles of the present invention.

The basic construct described above and shown in FIG. 3, can be utilized in modeling highly complex systems such as an entire digital audio/video decoder. Referring to FIG. 4, a simulation model for a digital audio/video decoder, interacting with surrounding circuitry, is shown. The digital audio/video decoder incorporates an MPEG decoder pipeline, modeled by an I/O module 40. Ports of the decoder pipeline are connected to data, address, control and interrupt channels 42, 44, 46 and 48, respectively. A RISC CPU internal to the audio/video decoder is similarly modeled by an I/O module 50, and is connected to the data, address, control and interrupt channels. Control signals from the RISC CPU are delivered to the decoder pipeline 40 via control channel 46, and the decoder pipeline responds by decoding data available via data channel 42 at addresses specified over address channel 44. Interrupts are delivered over interrupt channel 48 to notify RISC CPU 50 of the status of decoding.

Internal to decoder pipeline 40 are three additional I/O modules, modeling the behavior of a video layer decoder VLD 52, an inverse DCT transform engine IT 54, and a motion compensation engine MC 56 for forming output frames (B frames) from reference pictures (I and P frames) and motion vectors decoded by VLD 52. Channels 58, 60 and 62 interconnect VLD 52, IT 54 and MC 56 for delivery of motion vectors, DCT encoded pixel data and decoded pixel data, respectively.

As seen in FIG. 4, software/hardware co-simulation, or simulation of different components of a system at different levels of abstraction, is also supported. Gateway 70 is a special module, defined to pass/receive data to/from another simulator, in this case a register transfer level (RTL) simulator which, for example, may be simulating neighboring circuitry. A result value on a channel such as 42, 44 or 48 is transferred to the RTL simulator by the simulator engine, and input values from the RTL simulator are transferred to a channel as well. A gateway can further be used to compare the results on the channel from the results of a parallel RTL simulation.

Referring now to FIGS. 5A–5D, an explanation can be provided of the executable objects which perform a simulation in accordance with principles of the present invention. The basic module and channel constructs discussed above, are translated by the translation process described below, into three types of executable objects: channel objects, transition objects, and event function objects.

Figure 5A:
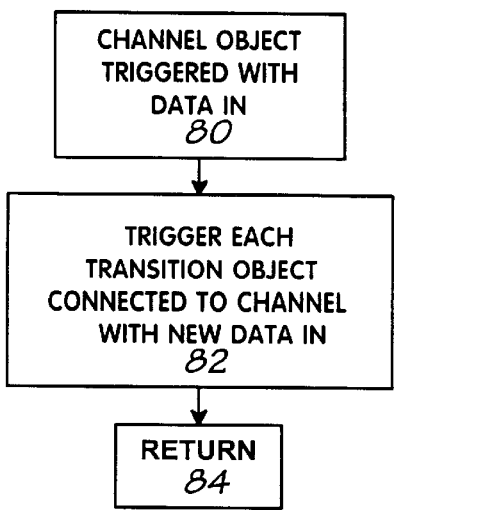
FIG. 5A is a flow chart of the operation of a typical channel object.

Channel objects are generated based on the listing of port connections provided in the source file for simulation. As seen in FIG. 5A, when a channel object is triggered by the delivery of data into the channel (step 80), the channel responds in step 82 by triggering each object connected to the channel, by delivering the new data received by the channel to each such object. (Typically, this will involve delivering new data to transition objects corresponding to each module having a port connected to the channel.) After thus triggering each object connected to the channel, the responsive activity of the channel is done (step 84).

Figure 5B:
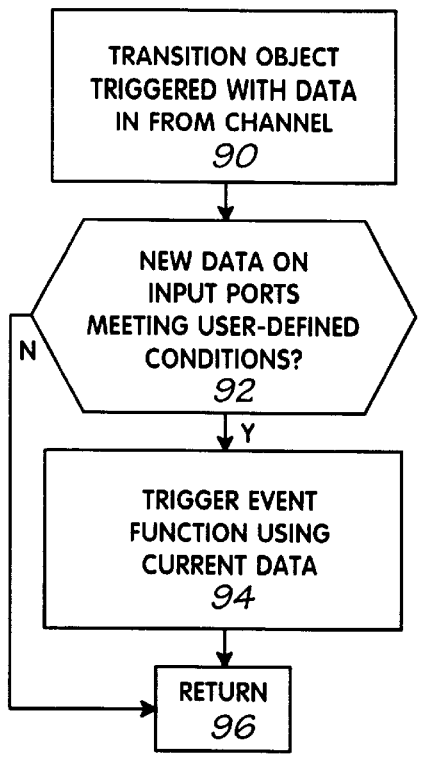
FIG. 5B is a flow chart of the operation of a typical transition object.

As noted above, module definitions are converted into transition objects and event function objects. The transition object generated from a module definition manages the receipt of data from the in ports of the module, and determines when the functions of the module ought to begin. Referring to FIG. 5B, when a transition object is triggered from data in from a channel (step 90), the transition object responds in step 92 by evaluating the new data received at its inputs to determine whether the new data meets user-defined conditions, as set forth in the original module definition from which the transition object was defined. If the new data received by the transition object meets the user-defined criteria, then in step 94 the transition object delivers a trigger to an event function generated from the function of the original module definition, supplying the current data received at the module's ports by the transition object. After step 94, or immediately after step 92 if the new data arriving at the module's ports does not meet the user-defined conditions, the transition object's processing is done (step 96).

Figure 5C:
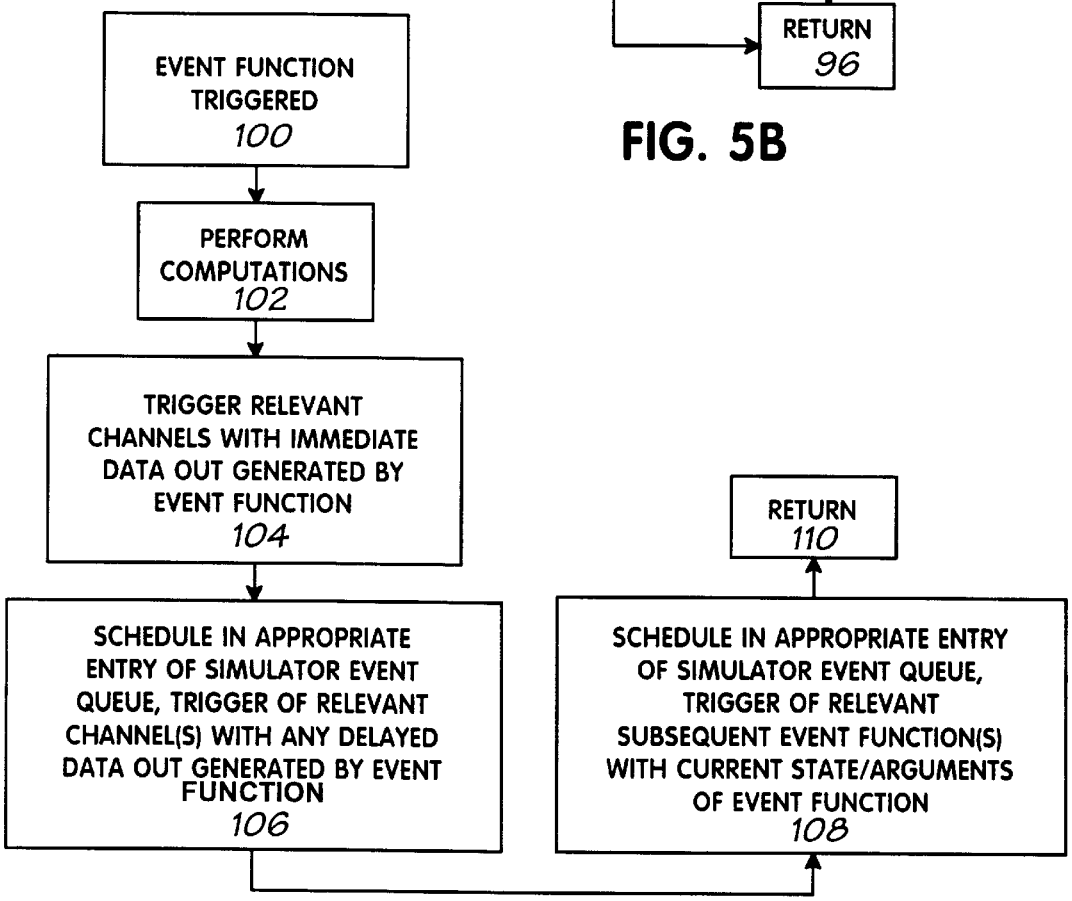
FIG. 5C is a flow chart of the operation of a typical event function.

Referring to FIG. 5C, when a event function object is triggered, from a transition object or from another event function object (step 100), in step 102 the event function performs the computations described in the original module definition from which the event function was generated. This may include utilizing calls to algorithm modules to perform low-level computations, as described above. After these computations, the event function object may take several different actions. If the function defined by the original module definition indicates that data is to be returned to a port, then in step 104 the event function object triggers the relevant channel objects connected to those ports, with the data out that was generated by the event function. If the function defined by the original module definition indicates that data is to be returned to a port after a delay period, then in step 106 the event function object schedules in the appropriate entry of a simulator event queue (see FIG. 6), a record of a trigger that is to be in the future delivered to the desired channel, including the channel identification and the data out generated by the event function. Finally, if the function defined by the original module definition indicates that some part of a calculation is to be performed at a later time, this later calculation will have been translated into a second or subsequent event function. In this circumstance, in step 108 the event function object schedules in the appropriate entry of the simulator event queue (see FIG. 6), a record of a trigger that is to be in the future delivered to the second or subsequent event function, including an identification of the second or subsequent event function and the arguments and current state (if any) of the event function generating the trigger, for use by the second event function. After any or all of these immediate or delayed triggers are generated, the event function is done (step 110).

Figure 5D:
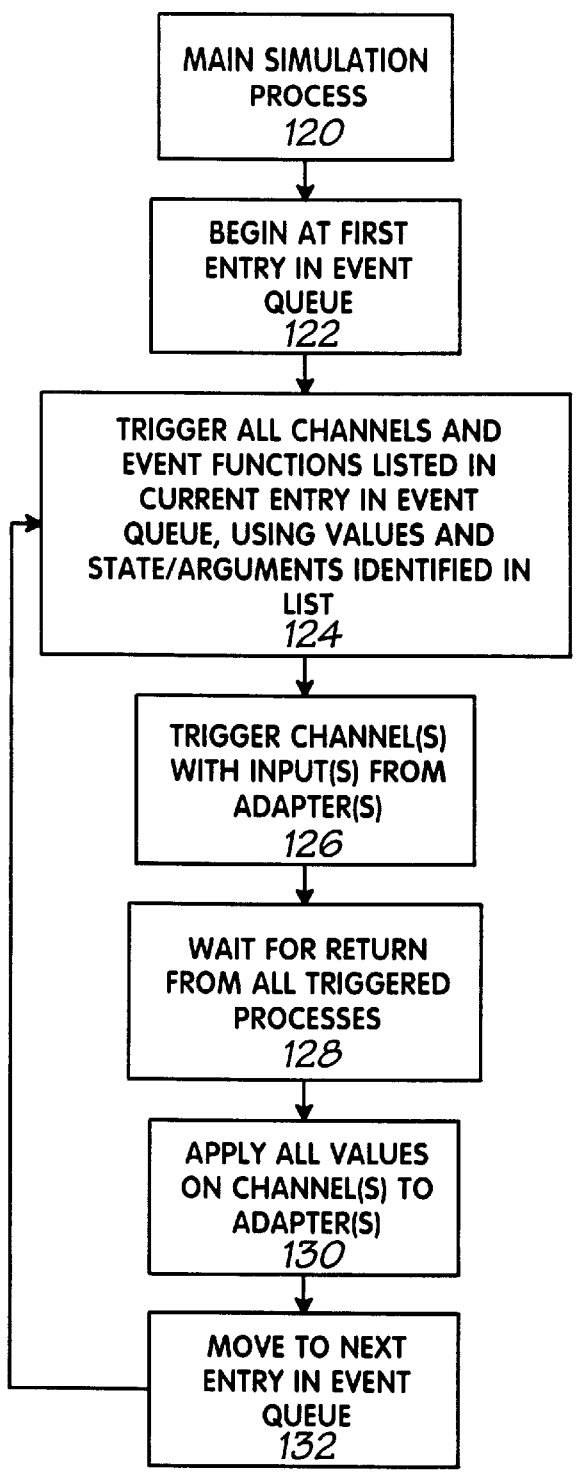
FIG. 5D is a flow chart of the operation of the main simulation process.

Referring now to FIG. 5D, the main simulation process 120 can be described. This process primarily manages the delivery of triggers stored on the event queue shown in FIG. 6, so as to move the simulation process forward in a pseudo cycle-driven manner. In step 122, the process begins at the first entry in the event queue. Initialization of the simulation process is performed by installing, into the first or subsequent entries in the event, channel or event function triggers simulating the initialization of the simulated system. Accordingly, the first entry in the event queue will typically include one or more triggers to channels or event functions to initialize the simulation.

In step 124, the main simulation process triggers all channels and event functions listed in the current (first) entry of the event queue, using the values and state/arguments that are stored in the list of triggers in the current entry. Then in step 126, if there is an adapter for a concurrent simulation, the channels connected to the adapter are triggered with any input signals being produced by the adapter.

The triggers produced in steps 124 and 126 will generate a chain reaction of calculations and triggers that will continue through the simulated system. Specifically, channels triggered in step 124 or 126 will trigger transition objects, some of which will transition event functions. Some of these event functions will trigger channels, which may then trigger additional transition objects and additional event functions. Also, event functions triggered in step 124 will similarly trigger transition objects and event functions. As this chain reaction continues, future triggers for channels and/or event functions will be stored on the event queue through the operation of event functions as described above with reference to FIG. 5C.

In step 128, the main simulation process awaits the end of this chain reaction of triggers, until the last triggered process returns. Ultimately, under normal circumstances, the chain reaction of triggers initiated in steps 124 and 126 will terminate, at which time the event queue entries after the current entry will typically contain lists of stored triggers for channels and event functions. These stored triggers identify actions that will be completed in future times in accordance with the simulation models used in the original module definitions used in the simulation.

After ending the wait in step 128, in step 130 the values found on the channels, representing the results of the first cycle of simulation, are applied to the adapter(s) used in the simulation, so as to stimulate the external simulations connected via the adapter(s). Then, in step 132, the main simulation process moves to the next entry in the event queue and processing returns to step 124, in which the various stored triggers in the current (second) entry of the event queue are delivered to the identified channels and event functions, and to step 126 where triggers corresponding to inputs from adapter(s) are delivered to channels, thus again triggering a chain reaction of triggers simulating the activity of a second cycle of simulation.

The loop including steps 124, 126, 128, 130 and 132 is then repeated continuously, or for a specified number of iterations, to perform a simulation of the simulated system over any desired period of time.

Figure 6:
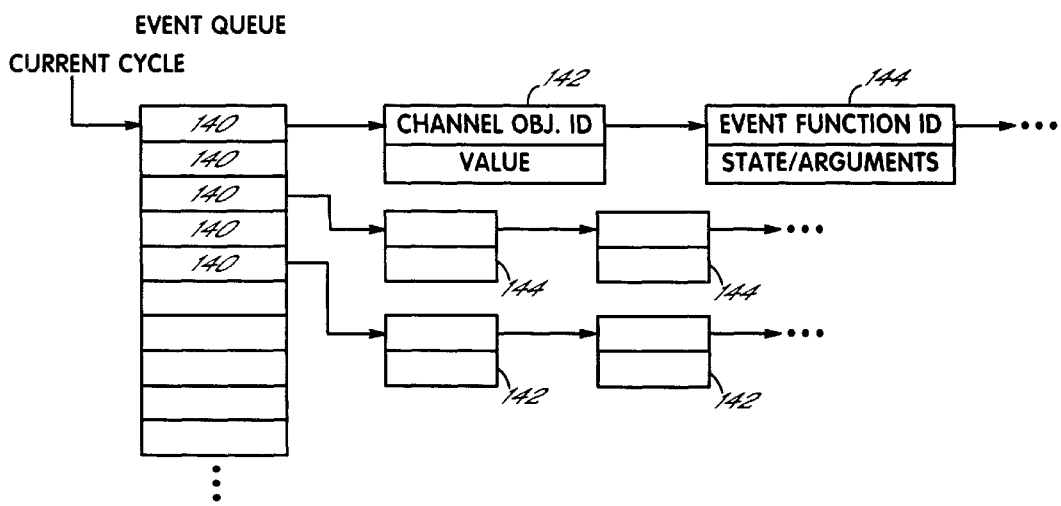
FIG. 6 is an illustration of the event queue used by the simulation process.

Referring now to FIG. 6, the structure of the event queue can be described. The queue includes a number of entries, each as described above representing a cycle of simulation. As shown in FIG. 6, each entry is the head of a linked list of data structures 142 or 144. Data structures 142 store information relating to a trigger to be delivered to a channel, and store a channel object identifier and data to be delivered to the channel. Data structures 144 store information relating to an event function to be triggered, and store an event function identifier and a state and/or arguments to be delivered to the event function.

Figure 1:
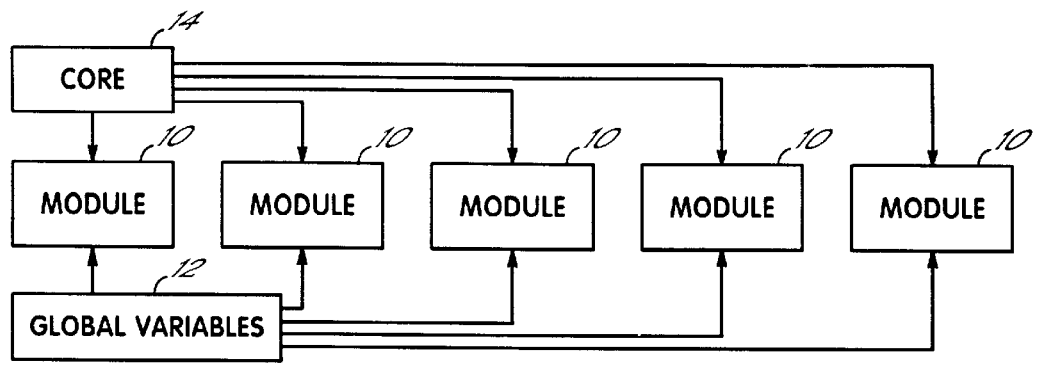
FIG. 1 is a functional diagram of a cycle-based simulator in accordance with the prior art.
Figure 2:
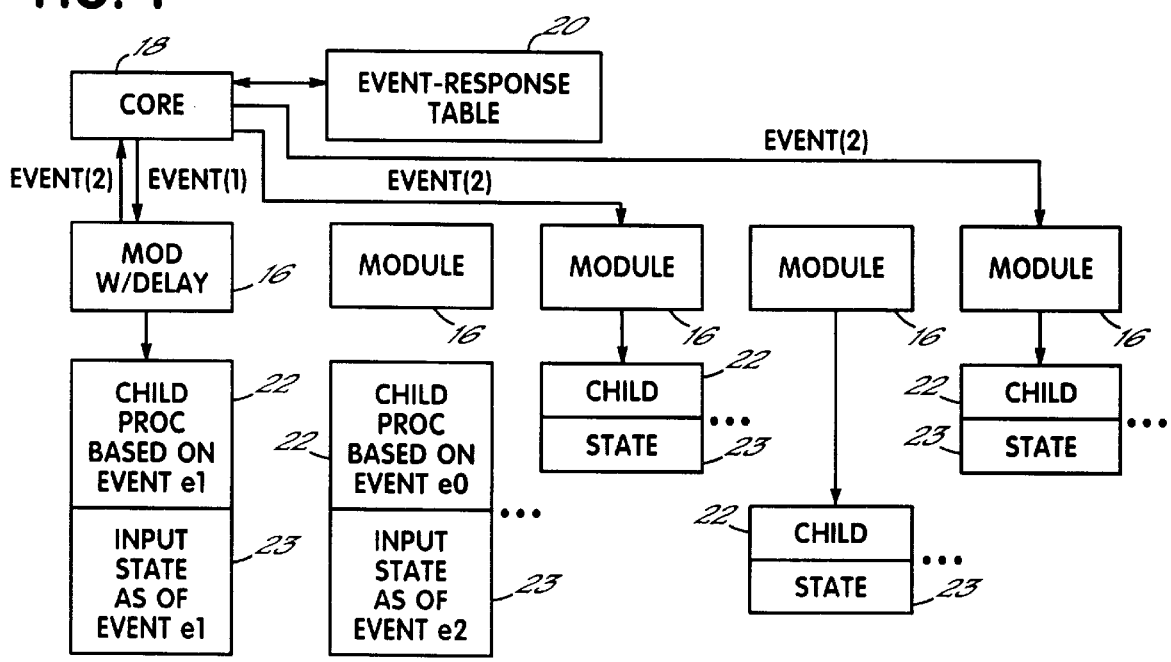
FIG. 2 is a functional diagram of an event-driven simulator in accordance with the prior art.
Figure 7B:
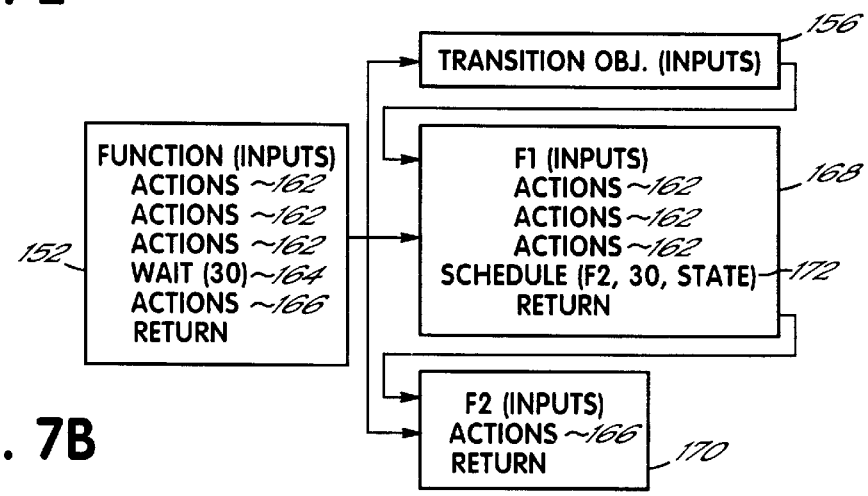
FIG. 7B is an illustration of the generation of a transition object and multiple event functions from a module definition.
Figure 7A:
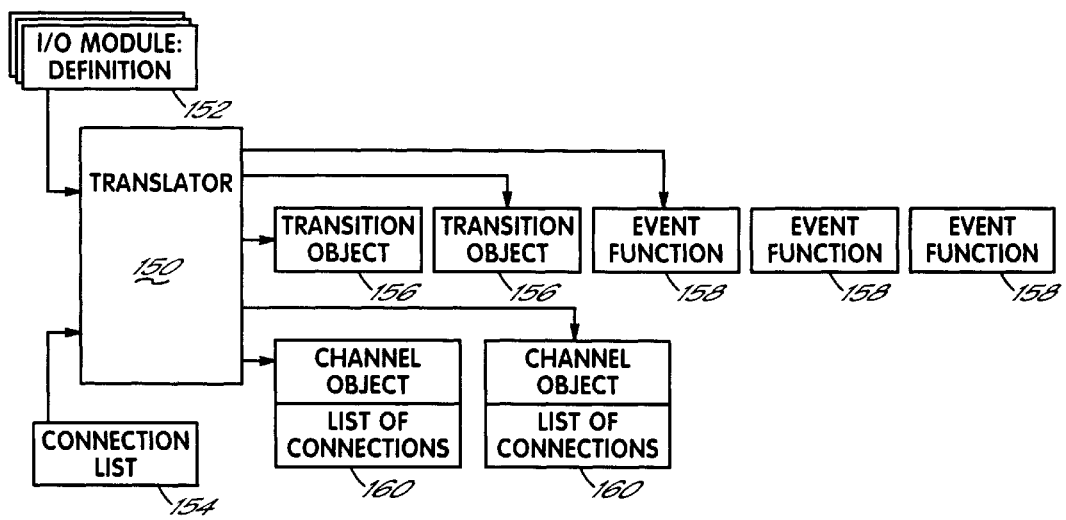
FIG. 7A is a functional diagram of the translation process operating upon I/O module definitions and a connection list to produce transition objects, event functions, and channel objects.

Referring now to FIG. 7A, the functional structure of the translation process can be described. As seen in FIG. 7A, the translation process 150 operates upon I/O module definitions 152 and a connection list 154 identifying the connections formed by the channels between the I/O modules. The translator operates upon this data to produce transition objects 156, one for each module definition, as well as event function objects 158, one or more for each module definition, and channel objects 160, one for each channel identified in the connection list 154. It will be noted that the channel objects 160 have embedded therein, in a conceptual sense, the connections identified in the original list 154, since the channel objects 160, as noted with reference to FIG. 5A, deliver triggers to all transition objects corresponding to modules connected to the channel.

Referring now to FIG. 7B, one operation of the translation process 150 can be further detailed. FIG. 7B shows a module definition 152 defining a module function including a number of calculations or other actions 162. These actions are followed by a statement 164, which causes further execution of the function to wait for 30 simulation cycles, after which additional actions 166 are performed, and the function is completed. As noted above, it is a design rule of the simulation system that all actions of an executable object must be completed in a single simulation cycle; accordingly, the wait statement 164 must be removed through the translation process.

As seen in FIG. 7B, this is accomplished by dividing the original module definition 152 into three executable objects. The first object is a transition object 168 which, as noted above, receives data from the channels connected to the module's ports and determines when the functions of the module are to be executed. The second object is an event function 168 that includes executable code corresponding to the actions identified in the original statements 162 of the original module definition 152. However, the actions identified in the statement 166 of the original module definition are not included in the event function 168. Rather, the actions of statement 166 are placed in a second or subsequent event function 170. The event function 168 terminates with executable code 172 which causes the event function 170 to be schedules on the event queue of FIG. 6 in an entry 30 cycles after the current entry. This has the effect of delaying further action including the action of statement 166, until after the passage of 30 simulation cycles. Notably, however, the event function 168 terminates after the scheduling code 172; accordingly, the event function 168 remains within the rule that all executable objects must complete execution in one simulation cycle. This approach, of breaking the actions defined in a single module definition into two event functions, permits the implementation of a design rule that all executable objects complete within one simulation cycle, without compromising the need to simulate computation or hardware pipeline time delays.

Referring now to FIG. 7C, an exemplary module definition, prepared in a C++ like syntax, can be seen. Notably, the module definition begins with an identification 172 of each of the ports used by the module, and with an identification of the function 174 of the module. Within the function of the module, are a number of statements to perform simulating calculations. Also notable in FIG. 7C is the inclusion, at the end of the module function, of dataOut statement 176 for delivering data out of a port of the module. Note that this statement also indicates that a delay of five simulations is to occur before the data is delivered to the port. This statement will thus be translated into executable code which causes a channel trigger including the data to be stored in the event queue at an entry 5 simulation cycles after the current entry.

FIG. 7D shows a system net-list including the actual instantiations of modules in the system and the channel interconnection of ports. This list includes a section 178 declaring all of the defined module types, a second 180 instantiating modules using the module definitions, and a second 182 providing a connection list for the channels to be used in the simulation.

In the translation process, the system net-list of the kind shown in FIG. 7D, and the module definitions, are parsed. A commercially available parser can be utilized for this step, by defining a grammar for the net-list and the module definitions. For every module instantiation, a C++ object of its class is defined. Connections in the connection list are replaced by channel objects, connecting input and output ports. For every module function, a Petri-net like transition object is added. The inputs of the transition object are exactly the input ports in the argument list of the function. The result of translation is a compatible C++ source that correctly combines the system to be simulated and the underlying simulation engine, which can then be compiled and run on a workstation.

Figure 8:
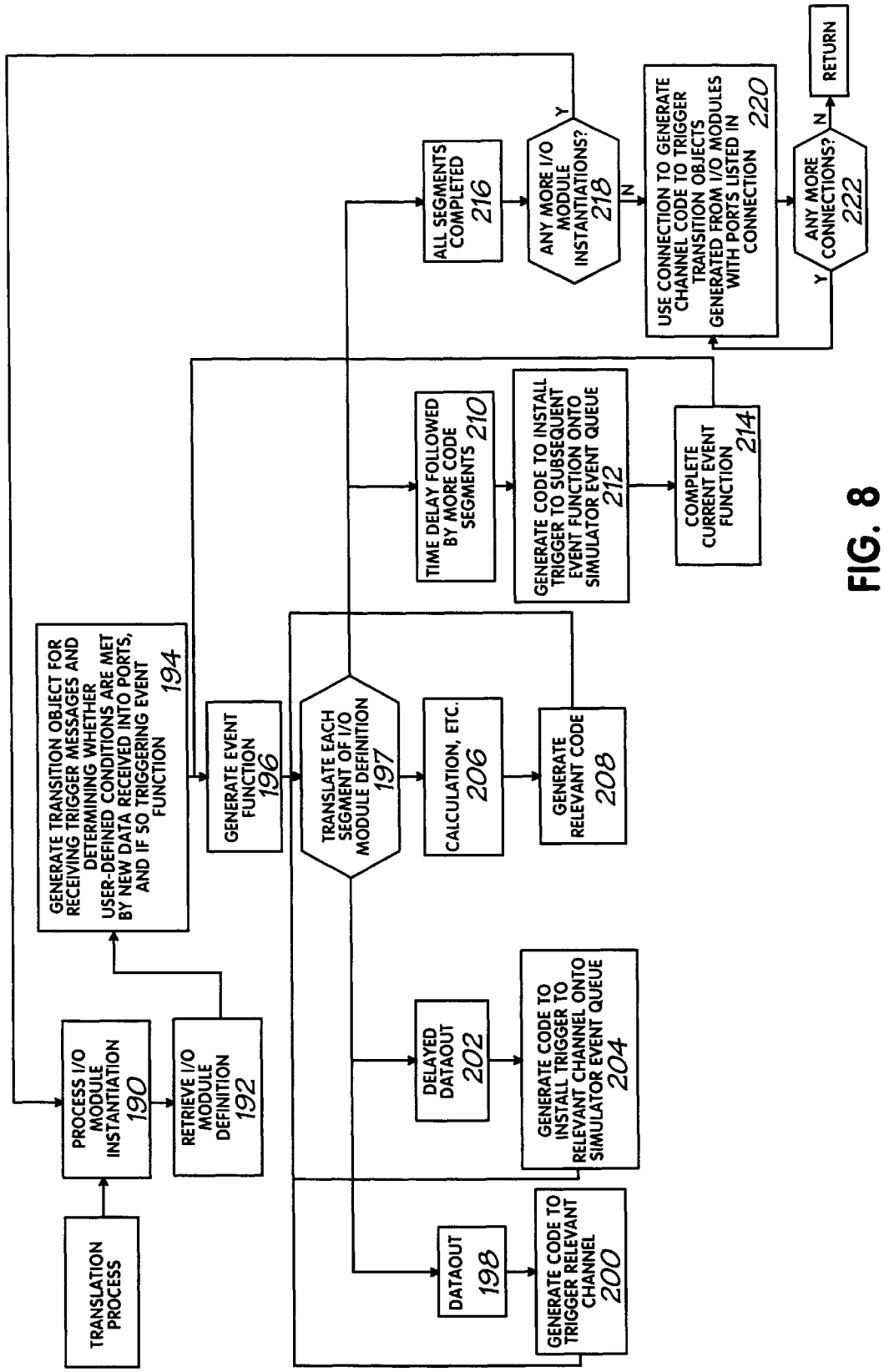
FIG. 8 is a flow chart for the translation process.

Referring now to FIG. 8, the actions performed by the translation process can be explained in greater detail. FIG. 8 indicates the actions taken upon the connection list and segments of module definitions by the parser as the parser operates upon the list and definitions. While FIG. 8 describes these actions in a linear fashion, i.e., reading the module definitions and connection list in a linear order, it will be appreciated that the actual activities of a commercially available parser in translating a defined module and connection list grammar can be substantially more complex.

In a first step 190, the translation process processes an I/O module instantiation; this involves in step 192 retrieving the module definition and in step 194 generating a transition object for receiving trigger messages from channels and determining whether the received data meets user-defined conditions found in the module definition, and if so triggering a new event function. In step 196, an event function is generated for the functions described by the module definition. In step 197 and the following steps, the translation process reads segments from the function described in the module definition and compares these segments to the module grammar to determine the appropriate action.

As noted above, when an immediate dataOut statement is found (step 198), it is translated in step 200 to code which will trigger the relevant channel. When a delayed dataOut statement is found (step 202), it is translated in step 204 to code which will install a trigger to the relevant channel onto the appropriate future entry of the simulator event queue. Wien a calculation, action or other similar statement is found (step 206), it is translated in step 2098 into the appropriate C++ code. Finally, when a time delay statement such as statement 164 of FIG. 7B is found (step 210), it is translated in step 212 into code to install a trigger to a new subsequent event function onto the simulator event queue. Then in step 214 the current event function is completed, and then processing returns to step 196 to generate a new event function for the statements and actions described by the module definition to occur after the time delay.

When a module definition is completely translated (step 216), if (step 218) and further module instantiations must be processed, then these are processed by returning to step 190. After all module instantiations are processed, then in step 220 code is generated for a channel, which will trigger all transition objects generated from I/O modules having ports connected to the channel. Step 220 is repeated for each connection identified in the connection list, until it is determined in step 222 that there are no more connections to process, at which point the translation process is done. The resulting C++ program can then be compiled and executed to perform the desired simulation. While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method of simulating the operation of a computing system, comprising
    providing a plurality of executable objects, each simulating an operation of a component of said computing system in response to a stimulus, at least one said object generating an indication of a stimulus to be applied at a time identified by reference to a cycle of simulation,
    in a current cycle of simulation, applying a stimulus to cause execution of some but not all of said executable objects, at least one executable object producing an indication of a delayed stimulus to be applied at a time identified by reference to a subsequent cycle of simulation, storing the produced indication of said delayed stimulus, and awaiting completion of execution of all executable objects, and thereafter
    in said subsequent cycle of simulation, applying said stored delayed stimulus to an executable object.

2. The method of claim 1 wherein at least one said executable object generates an immediate stimulus to be immediately applied to another executable object, and further comprising applying said immediate stimulus to said other executable object prior to said step of awaiting completion of execution of all executable objects.

3. The method of claim 1 wherein
    said executable objects include channel objects simulating a connection in said computing system, and transition objects and event function objects simulating a computational structure of said computing system.

4. The method of claim 3 wherein
    said event function objects, during execution, produce one or more immediate stimuli to be immediately applied to said channel objects, and one or more delayed stimuli to be applied later in time to said channel objects, and one or more delayed stimuli to be applied later in time to other event function objects,
    said channel objects, during execution, produce one or more immediate stimuli to be immediately applied to said transition objects, and
    said transition objects, during execution, apply conditions to stimuli applied thereto, and conditionally produce stimuli to be applied to said event function objects.

5. The method of claim 4 wherein one said transition object requires application of multiple stimuli thereto prior to producing stimuli to be applied to an event function object.

6. The method of claim 4 wherein providing said executable objects comprises translating module definitions defining operations of a computational structure of said computing system, into transition objects and event function objects.

7. The method of claim 4 wherein providing said executable objects comprises translating connection lists defining connections in said computing system into channel objects.

8. The method of claim 6 wherein
    a given segment of a given module definition requests production of a delayed stimulus at a later time, and
    translating said given module definition further comprises generating a first event function object and producing in response to said given segment, executable code in said first event function object that, during execution, will store said delayed stimulus for retrieval and execution after said step of awaiting completion of execution of all executable objects.

9. The method of claim 6 wherein
    a given module definition requests delayed execution of a given segment thereof, and
    translating said given module definition further comprises generating a first event function object and generating, in response to said given segment, executable code in said first event function object that, during execution, will deliver a stimulus to a second event function object, and generating said second event function object and executable code in said second event function that, during execution, will execute said given segment.

10. The method of claim 6 wherein
    a given segment of a given module definition requests production of an immediate stimulus, and translating said given module definition further comprises generating a first event function object and producing in response to said given segment, executable code in said first event function object that, during execution, will produce said immediate stimulus.

11. The method of claim 1 further comprising applying stimuli produced by execution of all executable objects, to another simulation system prior to applying said stored delayed stimulus to an executable object.

12. The method of claim 1 further comprising applying stimuli produced by another simulation system to executable objects after awaiting completion of execution of all executable objects.

13. A program product for simulating the operation of a computing system, comprising digital data media, said media storing
- a plurality of executable objects, each during execution simulating an operation of a component of said computing system in response to a stimulus, at least one said object generating an indication of a stimulus to be applied at a time identified by reference to a cycle of simulation,
- a core which during execution of a current cycle of simulation, applies a stimulus to cause execution of some but not all of said executable objects, at least one executable object producing an indication of a delayed stimulus to be applied at a time identified by reference to a subsequent cycle of simulation, stores the produced indication of said delayed stimulus, awaits completion of execution of all executable objects, and thereafter in said subsequent cycle of simulation applies said stored delayed stimulus to an executable object.

14. The program product of claim 13 wherein at least one said executable object, during execution, generates an immediate stimulus to be immediately applied to another executable object, and where said core applies said immediate stimulus to said other executable object prior to said step of awaiting completion of execution of all executable objects.

15. The program product of claim 13 wherein
said executable objects include channel objects simulating a connection in said computing system, and transition objects and event function objects simulating a computational structure of said computing system.

16. The program product of claim 15 wherein
said event function objects, during execution, produce one or more immediate stimuli to be immediately applied to said channel objects, and one or more delayed stimuli to be applied later in time to said channel objects, and one or more delayed stimuli to be applied later in time to other event function objects,
said channel objects, during execution, produce one or more immediate stimuli to be immediately applied to said transition objects, and
said transition objects, during execution, apply conditions to stimuli applied thereto, and conditionally produce stimuli to be applied to said event function objects.

17. The program product of claim 16 wherein one said transition object, during execution, requires application of multiple stimuli thereto prior to producing stimuli to be applied to an event function object.

18. The program product of claim 13 wherein said core further applies stimuli produced by execution of all executable objects, to another simulation system prior to applying said stored delayed stimulus to an executable object.

19. The program product of claim 13 wherein said core further applies stimuli produced by another simulation system to executable objects after awaiting completion of execution of all executable objects.

20. The program product of claim 13 wherein said digital data media is a transmission type media.

21. The program product of claim 13 wherein said digital data media is a storage type media.

22. A computing apparatus for simulating the operation of a computing system, comprising
- a memory device storing a plurality of executable objects, each simulating an operation of a component of said computing system in response to a stimulus, at least one said object generating an indication of a stimulus to be applied at a time identified by reference to a cycle of simulation,
- a computing system:
  in a current cycle of simulation, applying a stimulus to cause execution of some but not all of said executable objects, at least one executable object producing an indication of a delayed stimulus to be applied at a time identified by reference to a cycle of simulation, storing the produced indication of said delayed stimulus, awaiting completion of execution of all executable objects, and thereafter in said subsequent cycle of simulation, applying said stored delayed stimulus to an executable object.

23. The apparatus of claim 22 wherein at least one said executable object, during execution, generates an immediate stimulus to be immediately applied to another executable object, said computing system applying said immediate stimulus to said other executable object prior to awaiting completion of execution of all executable objects.

24. The apparatus of claim 22 wherein
said executable objects include channel objects simulating, during execution, a connection in said computing system, and transition objects and event function objects simulating, during execution, a computational structure of said computing system.

25. The apparatus of claim 24 wherein
said event function objects, during execution, produce one or more immediate stimuli to be immediately applied to said channel objects, and one or more delayed stimuli to be applied later in time to said channel objects, and one or more delayed stimuli to be applied later in time to other event function objects,
said channel objects, during execution, produce one or more immediate stimuli to be immediately applied to said transition objects, and
said transition objects, during execution, apply conditions to stimuli applied thereto, and conditionally produce stimuli to be applied to said event function objects.

26. The apparatus of claim 25 wherein one said transition object requires application of multiple stimuli thereto prior to producing stimuli to be applied to an event function object.

27. The apparatus of claim 22 wherein said computer system further applies stimuli produced by execution of all executable objects, to another simulation system prior to applying said stored delayed stimulus to an executable object.

28. The apparatus of claim 22 wherein said computer system further applies stimuli produced by another simulation system to executable objects after awaiting completion of execution of all executable objects.

29. The apparatus of claim 22 wherein said memory device is a mass storage device.

30. The apparatus of claim 22 wherein said computing system is a general purpose computer.

31. A method of simulating the operation of a computing system, comprising providing module definitions defining operations of a computational structure of said computing system, wherein a given segment of a given module definition requests delayed activity at a time identified by reference to a cycle of simulation, translating said given module definition into a first executable object; and producing in response to said given segment, executable code in said first executable object that, during execution, will store a description of said delayed activity with reference to a subsequent cycle of simulation for later retrieval and execution in said subsequent cycle of simulation.

32. The method of claim 31 further comprising providing connection lists defining connections in said computing system, and translating said connection lists into executable code in channel objects.

33. The method of claim 31 wherein said given module definition requests delayed execution of a given segment thereof, and further comprising translating said given module definition into a second executable object, and producing, in response to said given segment, executable code in said first executable object that, during execution, will deliver a stimulus to said second executable object, and executable code in said second executable that, during execution, will execute said given segment.

34. The method of claim 31 wherein said given module definition requests production of an immediate stimulus, and further comprising producing, in response to said given segment, executable code in said first executable object that, during execution, will produce said immediate stimulus.

35. A program product for simulating the operation of a computing system, comprising a digital data media, said media storing:

module definitions defining operations of a computational structure of said computing system, wherein a given segment of a given module definition requests delayed activity at a time identified by reference to a cycle of simulation, and a core which during execution translates said given module definition into a first executable object, and produces in response to said given segment, executable code in said first executable object that, during execution, will store a description of said delayed activity with reference to a subsequent cycle of simulation for later retrieval and execution in said subsequent cycle of simulation.

36. The program product of claim 35 wherein said media further stores connection lists defining connections in said computing system, and said core during execution translates said connection lists into executable code in channel objects.

37. The program product of claim 35 wherein said given module definition requests delayed execution of a given segment thereof, and wherein said core, during execution, translates said given module definition into a second executable object, and produces, in response to said given segment, executable code in said first executable object that, during execution, will deliver a stimulus to said second executable object, and executable code in said second executable that, during execution, will execute said given segment.

38. The program product of claim 35 wherein said given module definition requests production of an immediate stimulus, and wherein said core, during execution, produces, in response to said given segment, executable code in said first executable object that, during execution, will produce said immediate stimulus.

39. The program product of claim 35 wherein said digital data media is a transmission type media.

40. The program product of claim 35 wherein said digital data media is a storage type media.

41. A computing apparatus for simulating the operation of a computing system, comprising:

a memory device storing module definitions defining operations of a computational structure of said computing system, wherein a given segment of a given module definition requests delayed activity at a time identified by reference to a cycle of simulation, and a computing system:

translating said given module definition into a first executable object, and producing in response to said given segment, executable code in said first executable object that, during execution, will store a description of said delayed activity with reference to a subsequent cycle of simulation for later retrieval and execution in said subsequent cycle of simulation.

42. The apparatus of claim 41 wherein said memory device stores connection lists defining connections in said computing system, and said computing system translates said connection lists into executable code in channel objects.

43. The apparatus of claim 41 wherein said given module definition requests delayed execution of a given segment thereof, and said computing system further translates said given module definition into a second executable object, and produces, in response to said given segment, executable code in said first executable object that, during execution, will deliver a stimulus to said second executable object, and executable code in said second executable that, during execution, will execute said given segment.

44. The apparatus of claim 41 wherein said given module definition requests production of an immediate stimulus, and further said computing system further produces, in response to said given segment, executable code in said first executable object that, during execution, will produce said immediate stimulus.

45. The apparatus of claim 41 wherein said memory device is a mass storage device.

46. The apparatus of claim 41 wherein said computing system is a general purpose computer.

* * * * *

UNITED STATES PATENT AND TRADEMARK OFFICE
CERTIFICATE OF CORRECTION

| | |
|---|---|
| PATENT NO. | : 6,263,303 B1 |
| APPLICATION NO. | : 09/178676 |
| DATED | : July 17, 2001 |
| INVENTOR(S) | : Yu et al. |

It is certified that error appears in the above-identified patent and that said Letters Patent is hereby corrected as shown below:

Title Page, Line 1; Abstract, delete "An simulator particularly", insert --A simulator particularly--.

Column 1
Line 30, delete "As In the", insert --As in the--.
Line 50, delete "each Module 10. (new paragraph) When triggered", insert --each Module 10.
When triggered--. This is one paragraph.
Line 56-57, delete "hardware stricture.", insert --hardware structure--.

Column 2
Line 5, delete "in which may", insert --in which many--.
Line 27-28, delete "by an module", insert --by a module--.

Column 3, line 42, delete "ports, permits the", insert --ports, permit the--.

Column 5, line 44, delete "through the an automated", insert --through an automated--.

Column 10, line 12, delete "be schedules on", insert --be scheduled on--.

Column 11
Line 22, delete "Wien a calculation", insert --When a calculation--.
Line 23, delete "step 2098 into", insert --step 208 into--.

Column 15, line 29, Claim 33, delete "executable that, during", insert --executable object that, during--.

UNITED STATES PATENT AND TRADEMARK OFFICE
CERTIFICATE OF CORRECTION

PATENT NO. : 6,263,303 B1
APPLICATION NO. : 09/178676
DATED : July 17, 2001
INVENTOR(S) : Yu et al.

It is certified that error appears in the above-identified patent and that said Letters Patent is hereby corrected as shown below:

Column 16
 Line 6, Claim 37, delete "executable that, during", insert --executable object that, during--.
 Line 47, Claim 43, delete "executable that, during", insert --executable object that, during--.

Signed and Sealed this

Twenty-second Day of August, 2006

JON W. DUDAS
*Director of the United States Patent and Trademark Office*